(12) United States Patent
Takakuwa

(10) Patent No.: US 8,322,830 B2
(45) Date of Patent: Dec. 4, 2012

(54) PIEZOELECTRIC ELEMENT, LIQUID EJECTING HEAD, AND LIQUID EJECTING APPARATUS

(75) Inventor: Atsushi Takakuwa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 316 days.

(21) Appl. No.: 12/762,551

(22) Filed: Apr. 19, 2010

(65) Prior Publication Data

US 2010/0265301 A1    Oct. 21, 2010

(30) Foreign Application Priority Data

Apr. 20, 2009    (JP) ................... 2009-102010

(51) Int. Cl.
     *B41J 2/045*      (2006.01)
(52) U.S. Cl. .......... 347/71; 347/68; 347/70; 347/72
(58) Field of Classification Search .......... 347/68–72
See application file for complete search history.

(56) References Cited

FOREIGN PATENT DOCUMENTS

JP    2005-178293    7/2005

*Primary Examiner* — Matthew Luu
*Assistant Examiner* — Henok Legesse
(74) *Attorney, Agent, or Firm* — Workman Nydegger

(57) ABSTRACT

A piezoelectric element has a piezoelectric body, two electrodes sandwiching the piezoelectric body, a protective layer covering the piezoelectric body and the two electrodes, and an antistatic layer formed on and/or in the protective layer.

8 Claims, 6 Drawing Sheets

FIG. 3

| PROTECTIVE LAYER | ANTISTATIC LAYER | WITHSTAND VOLTAGE (V) | DISPLACEMENT (nm) |
|---|---|---|---|
| $Al_2O_3$: 100 nm | N.A. | 70 | 500 |
| $SiO_2$: 100 nm | N.A. | 50 | 600 |
| $Al_2O_3$: 50 nm | N.A. | 50 | 600 |
| $SiO_2$: 50 nm | N.A. | 30 | 700 |
| $Al_2O_3$: 100 nm | 50 nm | 85 | 490 |
| $SiO_2$: 100 nm | 50 nm | 75 | 580 |
| $Al_2O_3$: 50 nm | 50 nm | 75 | 590 |
| $SiO_2$: 50 nm | 50 nm | 60 | 680 |
| $Al_2O_3$: 50 nm | 500 nm | 80 | 540 |
| $SiO_2$: 50 nm | 500 nm | 70 | 620 |

PIEZOELECTRIC ELEMENT, LIQUID EJECTING HEAD, AND LIQUID EJECTING APPARATUS

BACKGROUND

1. Technical Field

The present invention relates to a piezoelectric element, a liquid ejecting head, and a liquid ejecting apparatus and particularly relates to a piezoelectric element, a liquid ejecting head, and a liquid ejecting apparatus that are free from electrification-induced dielectric breakdowns of the piezoelectric body contained therein.

2. Related Art

Piezoelectric elements are stretched or contracted on application of voltage, and their use includes the source of driving force for diaphragms and actuators for liquid ejecting heads (ink jet heads).

Piezoelectric elements for liquid ejecting heads, which require fine patterning, are made of a ferroelectric piezoelectric material, such as PZT (lead zirconate titanate). However, ink, water (moisture), and other external factors often degrade the pressure capacity and other properties of PZT. As a solution to this problem, JP-A-2005-178293 has proposed covering a piezoelectric element with a protective layer. This protective layer is preferably made of a highly insulating, low-dielectric, and highly waterproof material. More preferably, this material has a low Young's modulus for greater displacements.

However, such a highly insulating protective layer usually has a high dielectric constant and thus is easily electrified. Also, even a less dielectric protective layer may still be electrified by surrounding static electricity. If electrified, the protective layer may cause a dielectric breakdown of the piezoelectric body adjacent thereto.

SUMMARY

An advantage of some aspects of the invention is to provide a piezoelectric element protected from the influence by static electricity. An advantage of some other aspects of the invention is to provide a piezoelectric liquid ejecting head protected from the influence by static electricity. An advantage of some other aspects of the invention is to provide a piezoelectric liquid ejecting apparatus protected from the influence by static electricity.

An aspect of the piezoelectric element according to the invention has a piezoelectric body, two electrodes sandwiching the piezoelectric body, a protective layer covering the piezoelectric body and the two electrodes, and an antistatic layer formed on the protective layer and/or in the protective layer.

Under this configuration, positive and negative charges generated in the protective layer travel through the antistatic layer and are neutralized there, leaving a reduced number of charges in the protective layer. This prevents dielectric breakdowns from occurring in the piezoelectric body.

The antistatic layer preferably contains one or more selected from the group consisting of an antistatic siloxane composition, an antistatic surfactant, and an antistatic polymer composition. These materials can be easily formed into films and have a specific resistance appropriate for preventing electrification and current leakage.

The specific resistance of the antistatic layer is preferably in the range of $10^5$ to $10^{12}$ Ω·cm. This allows for the prevention of electrification and current leakage.

Also, the protective layer preferably contains any one selected from the group consisting of silicon oxide, silicon nitride, silicon oxide nitride, and aluminum oxide. These materials are favorable in waterproofness, insulation performance, flexibility, Young's modulus, and so forth.

The protective layer preferably contains any one selected from the group consisting of p-xylylene, polyimide, polyamide, epoxy, and phenol resins and an organic/inorganic hybrid material. These materials are highly hydrophobic and almost completely impermeable for gas.

The protective layer preferably contains a photosensitive material. This facilitates the patterning of the protective layer.

An aspect of the liquid ejecting head according to the invention has the piezoelectric element described above, a diaphragm having the piezoelectric element placed thereon, a pressure chamber sealed with the diaphragm at a portion of the wall thereof, and a nozzle communicating with the pressure chamber.

This configuration provides a liquid ejecting head protected from dielectric breakdowns of the piezoelectric body contained therein due to the electrification of the protective layer.

An aspect of the liquid ejecting apparatus according to the invention has the liquid ejecting head described above.

Under this configuration, which includes the use of the liquid ejecting head and piezoelectric element, the liquid ejecting apparatus is protected from dielectric breakdowns due to electrification and thus offers improved reliability.

BRIEF DESCRIPTION OF THE DRAWINGS

The invention will be described with reference to the accompanying drawings, wherein like numbers reference like elements.

FIG. 3 summarizes data demonstrating an advantage of an aspect of the invention.

DESCRIPTION OF EXEMPLARY EMBODIMENTS

In an aspect of the invention, an antistatic layer is formed on and/or in a protective film covering a piezoelectric body so that dielectric breakdowns can be prevented in the piezoelectric body.

Embodiment 1

Figure 1:
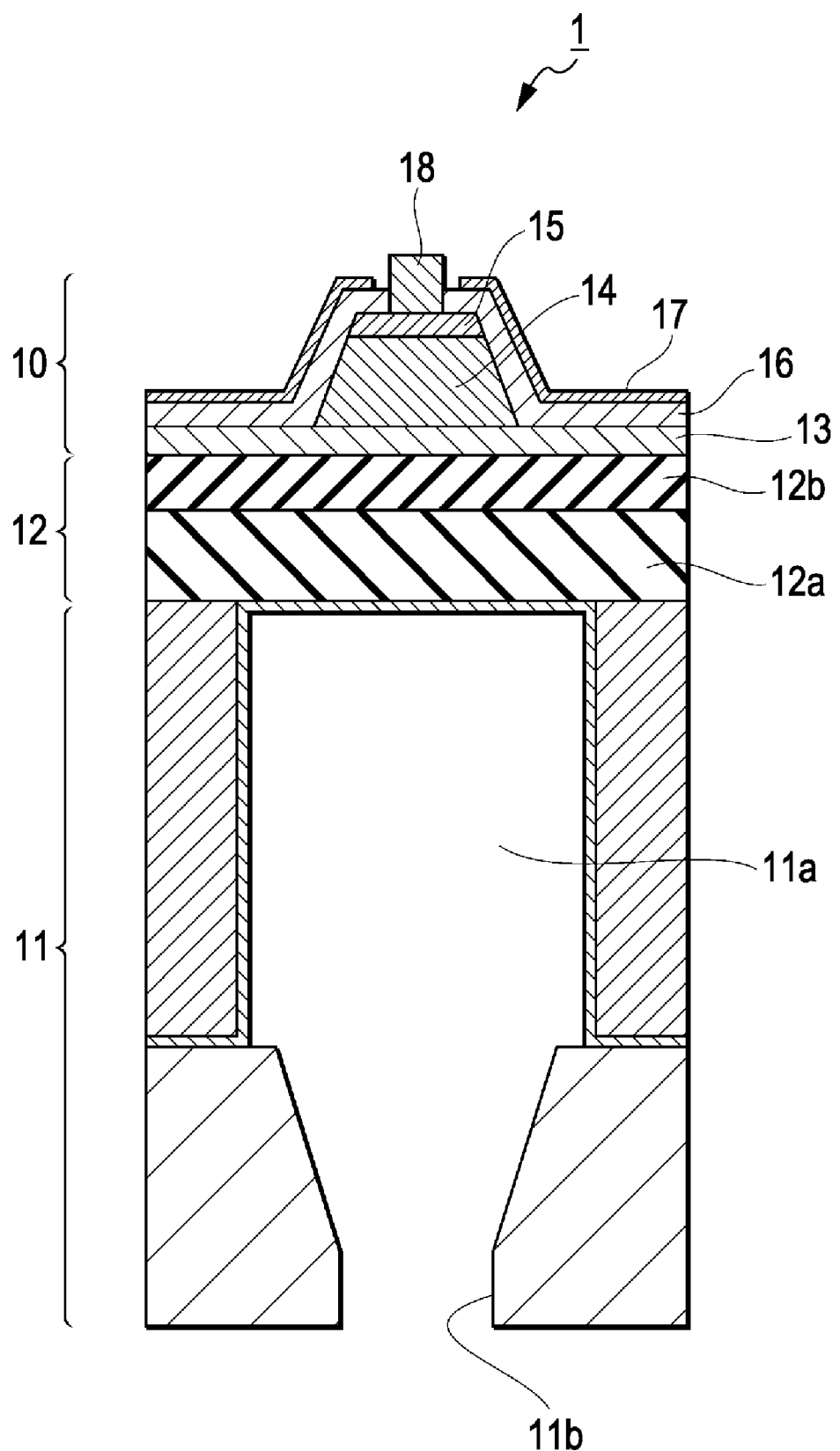
FIG. 1 illustrates an embodiment of the invention.

FIG. 1 illustrates a configuration of a liquid ejecting head having a piezoelectric element according to the invention. As shown in this drawing, the liquid ejecting head 1 has a substrate 11 having a hollow and a nozzle for ink, an elastic layer (diaphragm) 12 formed on the substrate 11, a lower electrode 13, a piezoelectric body 14 formed on the lower electrode 13, an upper electrode 15 formed on the piezoelectric body 14, a protective layer 16 covering the sides of the piezoelectric body 14 and the top of the upper electrode 15 to shield the piezoelectric body 14 from water and other contaminants, an antistatic layer 17 formed on the protective layer to prevent the protective layer 16 from being electrified, and some other components.

The lower electrode 13, piezoelectric body 14, upper electrode 15, protective layer 16, antistatic layer 17, and some other components compose a piezoelectric element 10. The upper electrode 15 is in contact with a lead wire 18.

The substrate 11 is organized by a flow channel substrate having pathways, a pressure chamber (hollow) 11a, and so forth, a nozzle plate having a nozzle 11b, and some other components. Examples of the material of the substrate 11 include silicon and other semiconductors, resins, and other substances appropriate for the intended use.

The elastic layer 12 is organized by, for example, a silicon oxide ($SiO_2$) layer 12a, which serves as an elastic body, and a zirconium oxide ($ZrO_2$) layer 12b, which serves as an insulating body, and is driven by the piezoelectric element 10 to oscillate. It serves as one of the walls of the hollow in the substrate 11, thereby allowing the hollow to act as the pressure chamber 11a. A fluid (e.g., ink or a liquid material) charged in the pressure chamber 11a by the oscillation of the elastic layer 12 is ejected via the nozzle 11b communicating with the pressure chamber 11a.

The lower electrode 13 and the upper electrode 15 are made of, for example, a high-melting metal such as iridium (Ir) or platinum (Pt) or an oxide such as iridium oxide ($IrO_2$), strontium ruthenium oxide ($SrRuO_3$), or lanthanum nickel oxide ($LaNiO_3$).

The piezoelectric body 14 is made of, for example, a ferroelectric oxide such as PZT [$Pb(Zr, Ti)O_3$], PZTN [$Pb(Zr, Ti, Nb)O_3$], $BaTiO_3$, or $(K, Na)NbO_3$.

The protective layer 16 covers the surface of the piezoelectric element 10, leaving an opening for the lead wire 18. It is made of, for example, silicon oxide, silicon nitride, silicon oxide nitride, aluminum oxide, or tantalum pentoxide ($Ta_2O_5$); however, it is preferably made of a highly flexible and low-Young's-modulus material for greater displacements of the piezoelectric body 14 during oscillation.

Silicon oxide is more flexible than the other materials mentioned above and is formed into a layer preferably by CVD of trimethoxysilane (TMS). By using TMS, a quality silicon oxide layer can be produced even at a low temperature with less hydrogen generated, and the damage to the piezoelectric body 14 from reduction reaction is suppressed.

The protective layer 16 may be made of a highly hydrophobic and highly flexible organic material instead. Examples of applicable materials include p-xylylene, polyimide, polyamide, epoxy, and phenol resins and organic/inorganic hybrid materials. Examples of p-xylylene resins include poly(monochloro-p-xylylene) (parylene C) and poly (p-xylylene) (parylene N). These resins are highly hydrophobic and almost completely impermeable for gas.

Organic/Inorganic hybrid materials, which contain organic and inorganic moieties mixed at the nanometer scale, have a synergistic effect of organic and inorganic compounds. These materials are represented by polysiloxane materials. Incidentally, organic materials and organic/inorganic hybrid materials can be made photosensitive; this allows for direct patterning by exposing the material to light through a mask or in some other ways, thereby simplifying the process involved.

The antistatic layer 17 is formed on the protective layer 16 and contains, as described later, an antistatic siloxane composition, an antistatic surfactant, or an antistatic polymer composition. The specific resistance of the antistatic layer 17 is preferably in the range of $10^5$ to $10^{12}$ $\Omega \cdot cm$.

Too high a specific resistance spoils the antistatic effect, whereas too low a specific resistance promotes current leakage. But for the antistatic layer 17, charges existing in the protective layer 16 would influence the piezoelectric body 14 to undergo a dielectric breakdown in a high electric field. The antistatic layer 17 decreases charges in the protective layer 16, thereby improving the withstand voltage of the piezoelectric body 14.

Embodiment 2

The following describes a method for manufacturing a piezoelectric element (liquid ejecting head) according to Embodiment 1, which has a protective layer and an antistatic layer covering it, with reference to FIGS. 2A to 2F.

(1) Forming a Piezoelectric Element

Figure 2A:
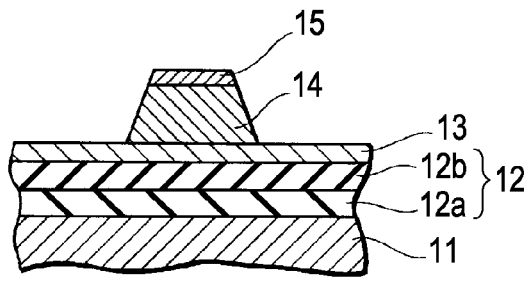
FIGS. 2A to 2F illustrate a manufacturing process according to an embodiment of the invention.

First, the structure shown in FIG. 2A is formed in the following way. One of the surfaces of a substrate 11, which is made of silicon single crystals or some other material, is oxidized by heating so that a silicon-dioxide-based elastic layer 12a can be formed with a thickness in the range of 1 to 2 μm. Then, an insulating layer 12b is formed, using zirconium oxide ($ZrO_2$) or some other material, with a thickness of about 0.4 μm on the elastic layer 12a. Then, platinum (Pt) or some other material is deposited by sputtering, vapor deposition, or some other method on the insulating layer 12b until the thickness reaches about 200 nm, yielding a lower electrode 13. Then, the lower electrode 13 is formed into a desired pattern.

A piezoelectric body 14 is formed, using lead zirconate titanate (PZT) or some other material, with a thickness of about 1000 nm on the lower electrode 13 by the sol-gel method or some other method. Then, platinum (Pt) is deposited by sputtering, vapor deposition, or some other method on the piezoelectric body 14 until the thickness reaches about 100 nm, yielding an upper electrode 15. Then, the piezoelectric body 14 and the upper electrode 15 are patterned so as to fit the pressure chamber 11a described in Embodiment 1. In this way, the piezoelectric element 10 is obtained.

The material of the lower electrode 13 and the upper electrode 15 is chosen from those described in Embodiment 1. The method for forming them may be sputtering, vapor deposition, printing, or any other possible method.

The material of the piezoelectric body 14 is chosen from those described in Embodiment 1. When lead zirconate titanate (PZT) is used, a metal-oxide-based piezoelectric body 14 is formed by applying a sol-gel solution containing lead (Pb), zirconium (Zr), and titanium (Ti) by spin coating, printing, or some other method, drying the coating obtained, and then burning the obtained film at a high temperature; however, MOD, sputtering, or any other possible method may be used instead.

(2) Forming a Protective Layer

Figure 2B:
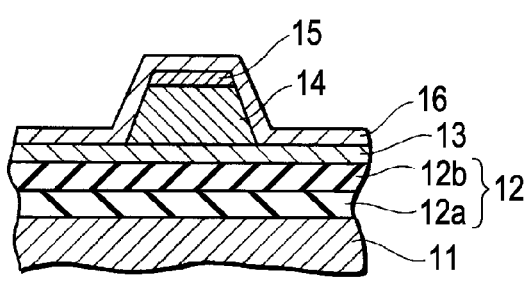

A protective layer 16 is formed to cover the lower electrode 13, the piezoelectric body 14, and the upper electrode 15 as shown in FIG. 2B. For example, when a silicon oxide film is used as the protective layer 16, trimethoxysilane (TMS) is deposited by CVD until the thickness reaches 50 to 100 nm.

By using TMS, a quality silicon oxide can be produced even at a low temperature with less hydrogen generated, and the damage to the piezoelectric body 14 from reduction reaction is suppressed.

When an aluminum oxide ($Al_2O_3$) film is used as the protective layer 16, the resulting film is harder than ones made from silicon oxide as described later but offers several advantages including effective prevention of moisture penetration. The thickness of such an aluminum-oxide-based protective layer is preferably on the order of 30 to 100 nm.

(3) Dielectrifying the Protective Layer

Figure 2C:
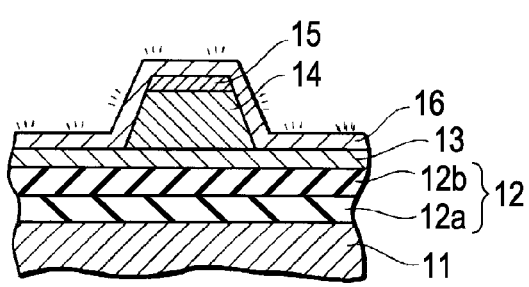

Before the formation of an antistatic layer 17, the protective layer 16 is dielectrified as shown in FIG. 2C. Dielectrification removes charges remaining in the protective layer 16, thereby improving the effect of the antistatic layer 17. An example method for dielectrification is as follows: A dielectrifier (an ionizer; not shown in the drawing) is used to generate, in the air or some other gas, charges (ions) opposite to those existing in the protective layer 16; the charges generated adhere to the protective layer 16 and neutralize the charges existing in it, thereby canceling static electricity.

(4) Forming an Antistatic Layer

Figure 2D:
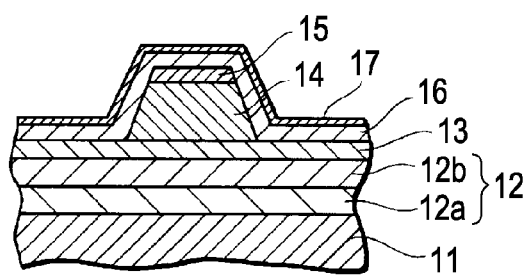

As shown in FIG. 2D, an antistatic layer 17 is formed with a thickness on the order of 50 to 500 nm on the protective layer 16. The antistatic layer 17 contains an antistatic siloxane composition, an antistatic surfactant, an antistatic polymer composition, or some other possible substance.

For example, an antistatic layer containing an antistatic siloxane composition can be formed by spin coating from a composition containing silica at 2%, ethanol 4%, 2-propanol 55%, 1-butanol 28%, ethyl acetate 2%, 2-ethoxyethyl acetate 2%, and water 2%.

An antistatic layer containing an antistatic surfactant can be formed by spin coating from a composition containing ethanol at 96%, an alkyl quaternary ammonium chloride 2%, isopropanol 1%, and water 1%.

An antistatic layer containing an antistatic polymer composition can be formed by spin coating from a composition containing an acrylic resin at 9.5%, methanol 7.5%, 2-propanol 1.5%, 1-butanol 60%, ethyl acetate 20%, and toluene 1.5%.

For the neutralization (transfer) of charges and the prevention of current leakage, the specific resistance of the antistatic layer 17 is controlled by the choice of material within the range of, for example, $10^5$ to $10^{12}$ Ω·cm.

Note that the antistatic layer 17 may be a layer or a laminate of appropriately combined layers of an antistatic siloxane composition, an antistatic surfactant, an antistatic polymer composition, and/or some other possible substance.

(5) Patterning the Antistatic Layer and the Protective Layer

Figure 2E:
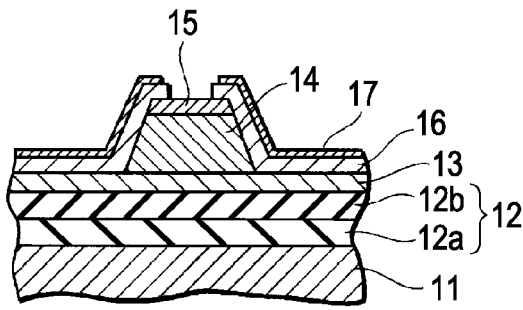

The antistatic layer 17 and the protective layer 16 are patterned as shown in FIG. 2E. An example method is as follows: The entire surface of the substrate 11 is coated with a photoresist; an etching mask is prepared by the exposure and development of the substrate 11 using a photomask patterned to cover the areas of the antistatic layer 17 that are on the piezoelectric element 10, leaving a contact hole for the upper electrode 15; the antistatic layer 17 is etched using the mask prepared; the entire surface of the structure obtained is coated with a photoresist once again; another etching mask is prepared by exposure and development using a photomask patterned to cover the areas of the protective layer 16 that are on the piezoelectric element 10, leaving a contact hole for the upper electrode 15; then, the protective layer 16 is etched using the mask prepared. As a result, the contact hole for the upper electrode 15 is wider at the level of the antistatic layer 17 than at the level of the protective layer 16.

(6) Wiring

Figure 2F:
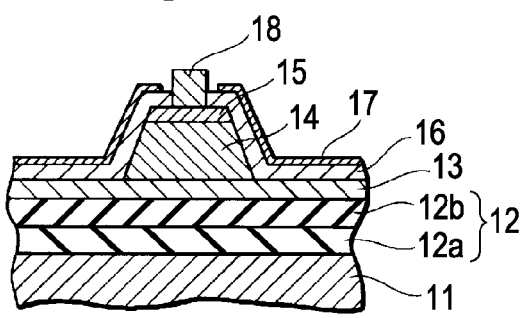

For electrical connection of the piezoelectric element 10, a lead wire 18 is formed as shown in FIG. 2F in the following way: A layer of a conductive material, such as gold, is formed by sputtering, vapor deposition, printing, an ink jet method, or some other possible method until the thickness reaches a desired value; then, the layer is patterned.

(7) Preparing a Substrate

The bottom surface of the substrate 11, on which the piezoelectric element 10 is not formed, is ground until the thickness reaches a desired value. Then, the substrate 11 is etched using a mask so that the pressure chamber 11a, pathways (not shown in the drawing), and other necessary components can be formed. Then, a nozzle plate having a nozzle 11b is attached to the substrate 11, yielding a liquid ejecting head bulk. Finally, unnecessary areas of the substrate 11 are cut away by dicing or some other possible method, leaving a finished liquid ejecting head.

FIG. 3 summarizes data demonstrating an advantage of the antistatic layer actually formed in the piezoelectric element obtained, namely, the withstand voltage and the displacement of the piezoelectric body as functions of the thickness and the material ($Al_2O_3$ or $SiO_2$) of the protective layer 16 and the thickness of the antistatic layer (an antistatic siloxane composition) 17. The thickness of the protective layer 16 was 100 or 50 nm, whereas that of the antistatic layer 17 was 0 (no antistatic layer formed), 50, or 500 nm. The other parameters were constant.

The results confirmed the following:

(1) With no antistatic layer, a great displacement and a high withstand voltage of the piezoelectric body hardly went together; once the antistatic layer was formed, however, the withstand voltage was improved with the displacement maintained; and (2) The thinner the antistatic layer was, the less the displacement was affected.

Embodiment 3

In a liquid ejecting head according to Embodiment 3, an antistatic layer is formed in a protective layer.

Figure 4:
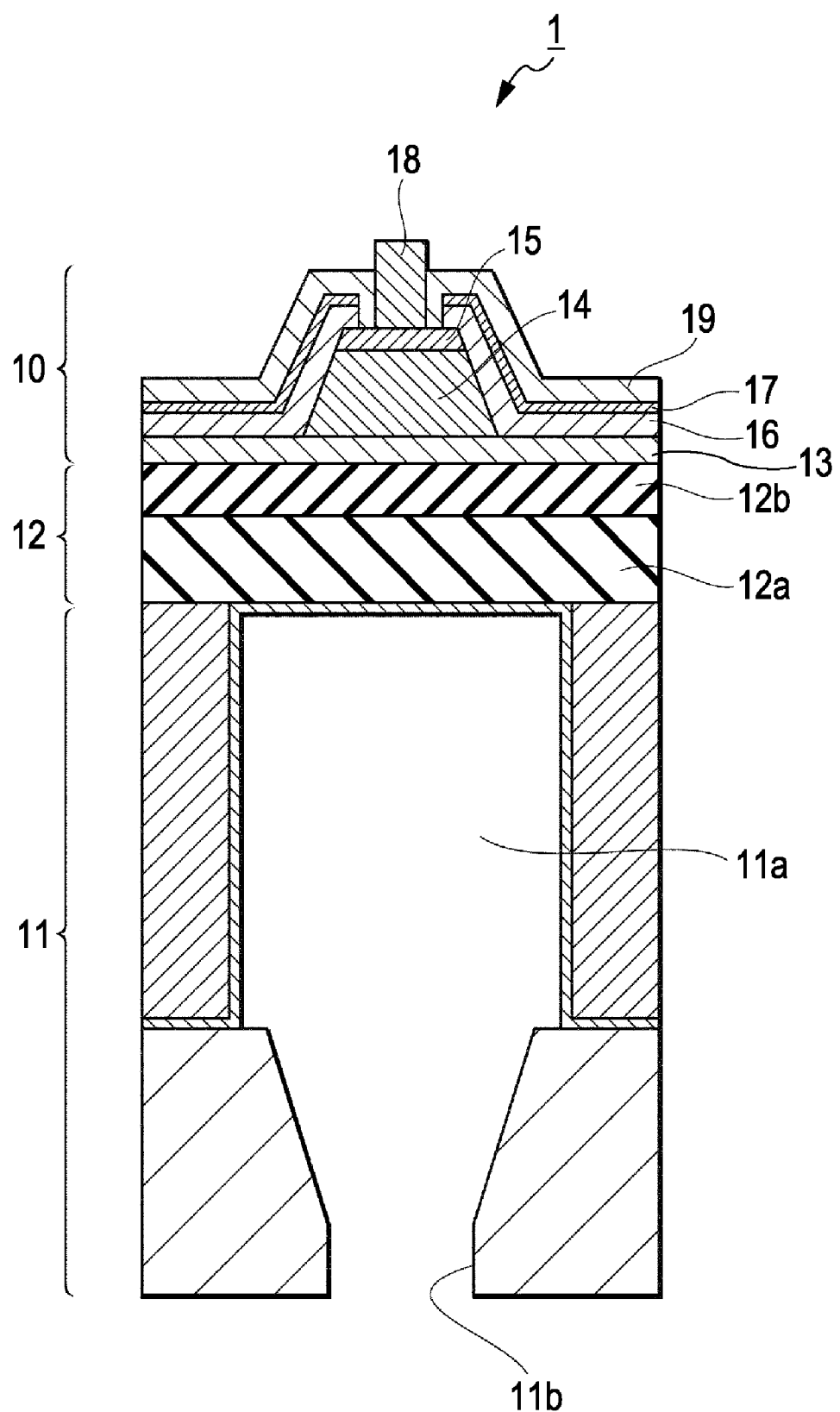
FIG. 4 illustrates an embodiment of the invention.

FIG. 4 illustrates a configuration of a liquid ejecting head having a piezoelectric element according to the invention. The numerals are defined the same as those in FIG. 1.

The liquid ejecting head 1 has a substrate 11 having a pressure chamber 11a and a nozzle 11b for ink, an elastic layer (diaphragm) 12 formed on the substrate 11, a lower electrode 13, a piezoelectric body 14 formed on the lower electrode 13, an upper electrode 15 formed on the piezoelectric body 14, a lower protective layer 16 covering the sides of the piezoelectric body 14 and the top of the upper electrode 15 to shield the piezoelectric body 14 from water and other contaminants, an antistatic layer 17 formed on the lower protective layer 16 to prevent the lower protective layer 16 from being electrified, an upper protective layer 19 formed on the antistatic layer 17, a lead wire 18, and some other components.

The lower electrode 13, piezoelectric body 14, upper electrode 15, lower protective layer 16, antistatic layer 17, upper protective layer 19, and some other components compose a piezoelectric element 10.

In this embodiment, the piezoelectric body 14 is protected by two protective layers, the lower one numbered 16 and the upper one 19, so that the antistatic layer 17 is sandwiched between the lower protective layer 16 and the upper protective layer 19. In other words, the antistatic layer 17 is formed in a protective layer. The antistatic layer 17 is in contact with the two protective layers 16 and 19 from inside and thus effectively removes charges existing in them.

For example, the lower protective layer 16 is made of silicon oxide, an inorganic material, whereas the upper protective layer 19 is made of a photosensitive organic material. This photosensitive organic material is flexible, and thus the upper protective layer 19 can exert its functions including shielding the piezoelectric element 10 from water with the displacement of the piezoelectric body 14 maintained. Made of a photosensitive organic material, the upper protective layer 19 is also easy to pattern; this simplifies the manufacturing process of the piezoelectric element 10. Note that this configuration is not mandatory; the two protective layers may be made of the same material.

Embodiment 4

The following describes a method for manufacturing a piezoelectric element (liquid ejecting head) according to Embodiment 3, in which a protective layer contains an antistatic layer, with reference to FIGS. 5A to 5H. The numerals are defined the same as those in FIGS. 2A to 2F.

Note that this embodiment includes almost the same processes as the following processes described in Embodiment 2: (1) Forming a piezoelectric element, (2) Forming a protection layer, (3) Diselectrifying the protective layer, and (4) Forming an antistatic layer.

(1) Forming a Piezoelectric Element

Figure 5A:
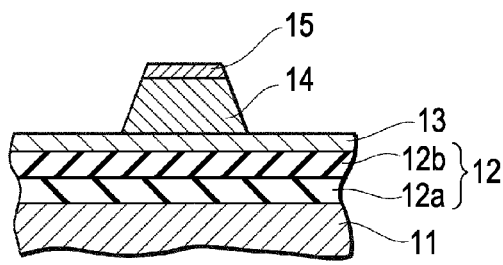
FIGS. 5A to 5H illustrate a manufacturing process according to an embodiment of the invention.

First, the structure shown in FIG. 5A is formed in the following way. One of the surfaces of a substrate 11, which is made of silicon single crystals or some other material, is oxidized by heating so that a silicon-dioxide-based elastic layer 12a can be formed with a thickness in the range of 1 to 2 μm. Then, an insulating layer 12b is formed, using zirconium oxide ($ZrO_2$) or some other material, with a thickness of about 0.4 μm on the elastic layer 12a. Then, platinum (Pt) and iridium (Ir) or some other material(s) are deposited on the insulating layer 12b, yielding a lower electrode 13. Then, the lower electrode 13 is formed into a predetermined pattern.

A piezoelectric body 14 is formed, using lead zirconate titanate (PZT) or some other material, on the lower electrode 13. Then, iridium (Ir) or some other material is deposited on the piezoelectric body 14, yielding an upper electrode 15. Then, the piezoelectric body 14 and the upper electrode 15 are patterned so as to fit the pressure chamber 11a described in Embodiment 3. In this way, the piezoelectric element 10 is obtained.

The material of the lower electrode 13 and the upper electrode 15 is chosen from those described in Embodiment 1. The method for forming them may be sputtering, vapor deposition, printing, or any other possible method.

The material of the piezoelectric body 14 is also chosen from those described in Embodiment 1. Applicable manufacturing methods are the same as those described in Embodiment 2.

(2) Forming a Lower Protective Layer

Figure 5E:
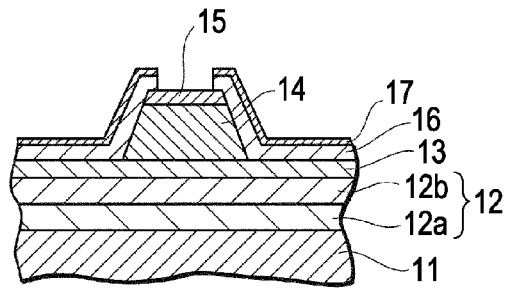
Figure 5B:
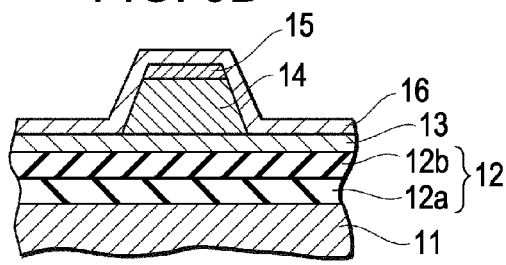

A lower protective layer 16 is formed to cover the lower electrode 13, the piezoelectric body 14, and the upper electrode 15 as shown in FIG. 5B. For example, when a silicon oxide film is used as the lower protective layer 16, trimethoxysilane (TMS) is deposited by CVD.

The lower protective layer 16 can be made of, for example, silicon oxide, silicon nitride, silicon oxide nitride, aluminum oxide, or the like; however, it is preferably made of a material that is as flexible as possible and has a low Young's modulus. Silicon oxide is more flexible than the other materials mentioned above and is formed into a layer preferably by CVD of trimethoxysilane (TMS). By using TMS, a quality silicon oxide layer can be produced even at a low temperature with less hydrogen generated, and the damage to the piezoelectric body 14 from reduction reaction is suppressed. When an aluminum oxide ($Al_2O_3$) film is used as the lower protective layer 16, the resulting film offers several advantages including effective prevention of moisture penetration.

(3) Diselectrifying the Lower Protective Layer

Figure 5F:
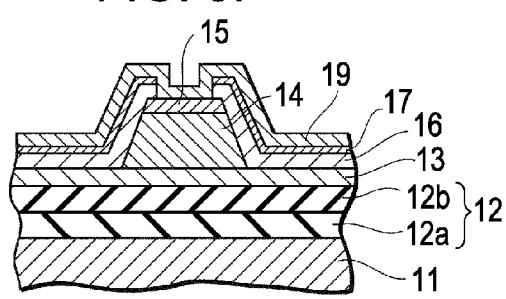
Figure 5C:
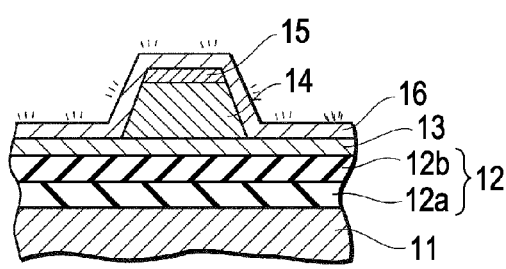

Before the formation of an antistatic layer 17, the lower protective layer 16 is diselectrified as shown in FIG. 5C. Diselectrification removes charges remaining in the lower protective layer 16, thereby improving the effect of the antistatic layer 17. An example diselectrification method is one described in (3) Diselectrifying the protective layer, Embodiment 2.

(4) Forming an Antistatic Layer

Figure 5G:
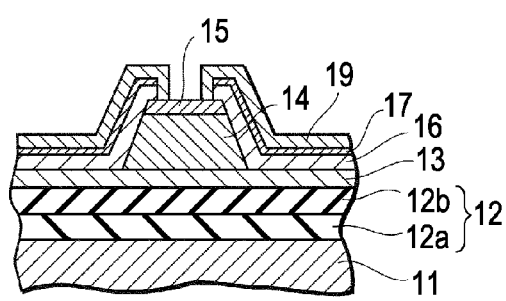
Figure 5D:
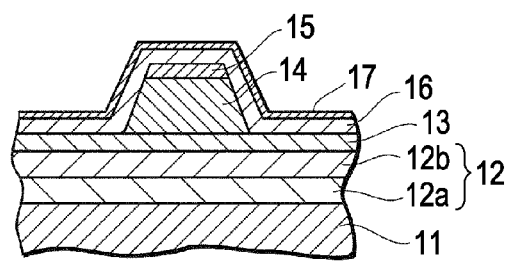

As shown in FIG. 5D, an antistatic layer 17 is formed with a thickness on the order of 50 to 500 nm on the lower protective layer 16. As described in (4) Forming an antistatic layer, Embodiment 2, the antistatic layer 17 contains an antistatic siloxane composition, an antistatic surfactant, an antistatic polymer composition, or some other possible substance.

For the neutralization (transfer) of charges and the prevention of current leakage, the specific resistance of the antistatic layer 17 is controlled by the choice of material within the range of, for example, $10^5$ to $10^{12} \Omega \cdot cm$.

Note that the antistatic layer 17 may be a layer or a laminate of appropriately combined layers of an antistatic siloxane composition, an antistatic surfactant, an antistatic polymer composition, and/or some other possible substance.

(5) Patterning the Antistatic Layer and the Lower Protective Layer

The antistatic layer 17 and the lower protective layer 16 are patterned as shown in FIG. 5E. An example method is as follows: The entire surface of the substrate 11 is coated with a photoresist; etching masks are prepared by exposure and development using photomasks individually patterned to cover the areas of the lower protective layer 16 and the antistatic layer 17 that are on the piezoelectric element 10, leaving a contact hole for the upper electrode 15; then, the lower protective layer 16 and the antistatic layer 17 are etched using the masks prepared; as a result, an opening is left as the contact hole for the upper electrode 15.

(6) Forming an Upper Protective Layer

As shown in FIG. 5F, the top of the structure obtained is completely covered with an upper protective layer 19 so that the antistatic layer 17 and the contact hole are sealed. An example material of the upper protective layer 19 is a highly hydrophobic and highly flexible organic material, such as one selected from those materials described above, namely, p-xylylene, polyimide, polyamide, epoxy, and phenol resins and an organic/inorganic hybrid material. Examples of p-xylylene resins include poly(monochloro-p-xylylene) (parylene C) and poly(p-xylylene) (parylene N). These resins are highly hydrophobic and almost completely impermeable for gas. Organic/Inorganic hybrid materials, which contain organic and inorganic moieties mixed at the nanometer scale, have a synergistic effect of organic and inorganic compounds. These materials are represented by polysiloxane materials. Organic/Inorganic hybrid materials can be made photosensitive; this allows for direct patterning by exposing the material to light through a mask or in some other ways, thereby simplifying the process involved. In an example of the invention, the upper protective layer 19 was a photosensitive polyimide film.

(7) Recovering the Contact Hole

As shown in FIG. 5G, the upper protective layer 19 is patterned to have an opening for the contact hole. In the above-mentioned example of the invention, the upper protective layer 19, a photosensitive polyimide film, was covered with a mask having an opening to fit the contact hole and then formed into a pattern by exposure and development, leaving an opening for the upper electrode 15. Made of a photosensitive material as described above, the upper protective layer 19 can be patterned without etching, and this simplifies the process involved. Furthermore, the upper protective layer 19 covers the wall of the contact hole and thus keeps a lead wire

18, which is described later, and the antistatic layer 17 separate, thereby ensuring better insulation.

Note that a single material may be used for both the upper protective layer 19 and the lower protective layer 16.

(8) Wiring

Figure 5H:
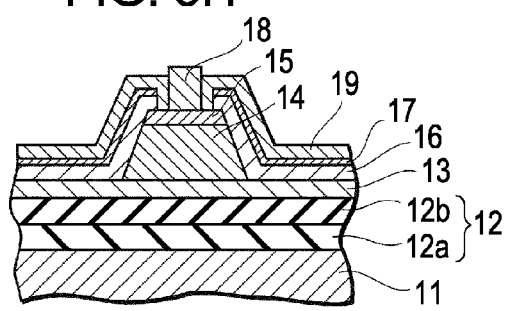

For electrical connection of the piezoelectric element 10, a lead wire 18 is formed as shown in FIG. 5H in the following way: A layer of a conductive material, such as gold, is formed by sputtering, vapor deposition, printing, an ink jet method, or some other possible method; then, the layer formed is patterned.

(9) Preparing a Substrate

The bottom surface of the substrate 11, on which the piezoelectric element 10 is not formed, is ground until the thickness reaches a desired value. Then, the substrate 11 is etched using a mask so that the pressure chamber 11a, pathways (not shown in the drawing), and other necessary components can be formed. Then, a nozzle plate having a nozzle 11b is attached to the substrate 11, yielding a liquid ejecting head bulk. Finally, unnecessary areas of the substrate 11 are cut away by dicing or some other possible method, leaving a finished liquid ejecting head.

Printer

Figure 6:
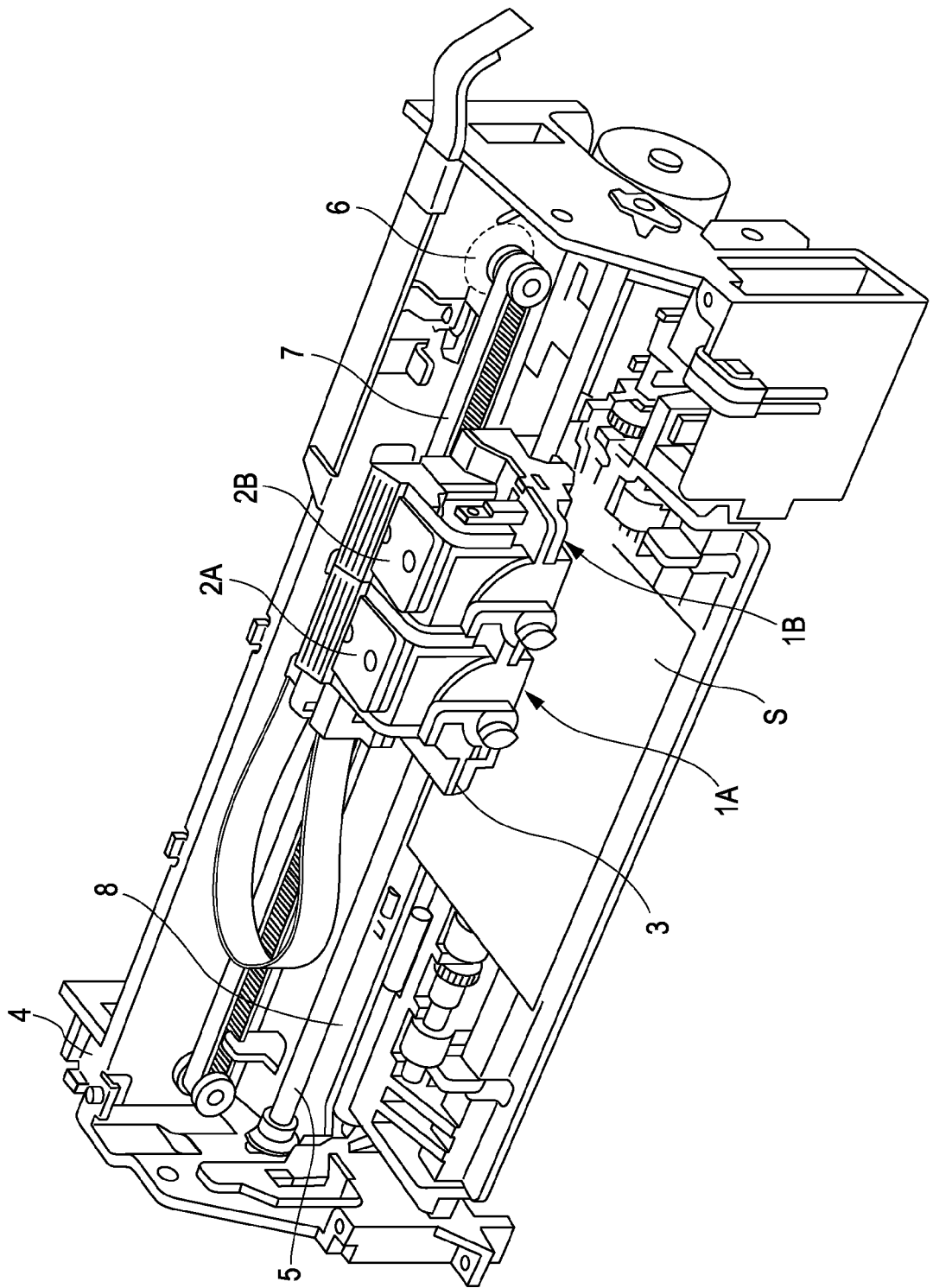
FIG. 6 is a perspective view of a liquid ejecting apparatus having a liquid ejecting head according to an aspect of the invention.

FIG. 6 shows a printer equipped with the above-described liquid ejecting head. To be mounted in such an ink jet recording apparatus (a liquid ejecting apparatus), the liquid ejecting head serves as a component of a recording head unit that has ink channels communicating with ink cartridges or the like.

As shown in FIG. 6, recording head units 1A and 1B, which each have the ink jet recording head, have detachable cartridges 2A and 2B, ink supply means, and mounted on a carriage 3. The carriage 3 can freely slide along a carriage shaft 5 provided in the main unit 4. The recording head units 1A and 1B discharge, for example, a black ink composition and a color ink composition, respectively. A motor 6 generates driving force; the driving force is transmitted via gears (not shown in the drawing) and a timing belt 7 to the carriage 3, thereby driving the carriage 3 to slide along the carriage shaft 5.

Incidentally, the main unit 4 has a platen 8 extending along the carriage shaft 5; the platen 8 transports recording sheets S, sheets of paper or some other recording medium, fed by a roller or the like (not shown in the drawing).

Although the above-described embodiment describes an ink jet recording head, the basic configuration of a liquid ejecting head according to an aspect of the invention is never limited to it. The invention is applicable to a wide variety of liquid ejecting heads, including those for a liquid other than ink. Examples of other liquid ejecting heads covered include recording heads for a printer or other kinds of liquid ejecting apparatuses, colorant ejecting heads for manufacturing of liquid crystal displays or other kinds of color filters, electrode material ejecting heads for forming electrodes for organic EL displays, field emission displays (FEDs), or the like, bioorganic substance ejecting heads for manufacturing of biochips, and so forth.

In conclusion, an aspect of the invention involves the formation of an antistatic layer on or in an easily electrifiable protective layer; thus, it provides a piezoelectric element protected from dielectric breakdowns of the piezoelectric body contained therein and also provides a liquid ejecting head and a liquid ejecting apparatus that are reliable.

What is claimed is:

1. A piezoelectric element comprising:
   a piezoelectric body;
   two electrodes sandwiching the piezoelectric body;
   a protective layer covering the piezoelectric body and the two electrodes; and
   an antistatic layer formed on and/or in the protective layer.

2. The piezoelectric element according to claim 1, wherein:
   the antistatic layer contains at least one selected from the group consisting of an antistatic siloxane composition, an antistatic surfactant, and an antistatic polymer composition.

3. The piezoelectric element according to claim 1, wherein:
   the specific resistance of the antistatic layer is in the range of $10^5$ to $10^{12}$ Ω·cm.

4. The piezoelectric element according to claim 1, wherein:
   the protective layer contains any one selected from the group consisting of silicon oxide, silicon nitride, silicon oxide nitride, and aluminum oxide.

5. The piezoelectric element according to claim 1, wherein:
   the protective layer contains any one selected from the group consisting of p-xylylene, polyimide, polyamide, epoxy, and phenol resins and an organic/inorganic hybrid material.

6. The piezoelectric element according to claim 1, wherein:
   the protective layer contains a photosensitive material.

7. A liquid ejecting head comprising:
   the piezoelectric element according to claim 1;
   a diaphragm having the piezoelectric element placed thereon;
   a pressure chamber sealed with the diaphragm at a portion of the wall thereof; and
   a nozzle communicating with the pressure chamber.

8. A liquid ejecting apparatus comprising:
   the liquid ejecting head according to claim 7.

* * * * *